United States Patent
Tanaka et al.

(10) Patent No.: US 7,369,592 B2
(45) Date of Patent: May 6, 2008

(54) SEMICONDUCTOR LASER DEVICE

(75) Inventors: Akira Tanaka, Kanagawa-ken (JP);
Masaaki Onomura, Tokyo (JP)

(73) Assignee: Kabushiki Kaisha Toshiba, Minato-Ku, Tokyo (JP)

( * ) Notice: Subject to any disclaimer, the term of this patent is extended or adjusted under 35 U.S.C. 154(b) by 44 days.

(21) Appl. No.: 11/374,072

(22) Filed: Mar. 14, 2006

(65) Prior Publication Data
US 2007/0086497 A1    Apr. 19, 2007

(30) Foreign Application Priority Data
Oct. 13, 2005    (JP) .............................. 2005-299211

(51) Int. Cl.
*H01S 3/04* (2006.01)
(52) U.S. Cl. ............................. 372/43.01; 372/38.05; 372/87
(58) Field of Classification Search ............. 372/43.01, 372/38.05, 87
See application file for complete search history.

(56) References Cited

U.S. PATENT DOCUMENTS 6,018,540 A * 1/2000 Kinoshita ................ 372/46.01
6,775,311 B2 * 8/2004 Hirukawa ................ 372/46.01
2002/0159494 A1 * 10/2002 Tojo et al. .................... 372/46

FOREIGN PATENT DOCUMENTS

JP    2003-086902    3/2003

OTHER PUBLICATIONS

Co-pending U.S. Appl. No. 11/276,240, filed Feb. 20, 2006.

* cited by examiner

*Primary Examiner*—Minsun Oh Harvey
*Assistant Examiner*—Xinning(Tom) Niu
(74) *Attorney, Agent, or Firm*—Banner & Witcoff, Ltd

(57) ABSTRACT

A semiconductor laser device comprises: an active layer; a cladding layer of a first conductivity type; an insulating film; a first electrode; and a pad electrode provided on the first electrode. The cladding layer is provided above the active layer, and has a ridge portion constituting a striped waveguide and non-ridge portions adjacent to both sides of the ridge portion. The insulating film is covering side faces of the ridge portion and an upper face of the non-ridge portions. The first electrode has a gap portion provided above the non-ridge portions. The pad electrode is provided on the first electrode.

20 Claims, 12 Drawing Sheets

SEMICONDUCTOR LASER DEVICE

CROSS-REFERENCE TO RELATED APPLICATIONS

This application is based upon and claims the benefits of priorities from the prior Japanese Patent Application No. 2005-299211, filed on Oct. 13, 2005; the entire contents of which are incorporated herein by reference.

BACKGROUND OF THE INVENTION

DVD (Digital Versatile Disc) and other optical disc recording applications require a semiconductor laser beam with higher optical output to increase recording speed. For example, optical output exceeding 100 mW is desired for gallium nitride based semiconductor laser devices in the 400 nm wavelength band for use in the next generation DVD applications.

Such high output operation involves a large amount of heat generation from the active layer that emits the laser beam. However, the optical output of a semiconductor laser device decreases when it is used in a temperature range above the maximum lasing temperature.

In general, as the temperature of a semiconductor layer increases, its refractive index also increases. Therefore, when a large temperature difference occurs in the waveguide or near the active layer, the refractive index difference within that region increases. This changes optical confinement of the horizontal transverse mode in particular, and thereby higher order modes are more likely to occur.

Furthermore, in high output operation, higher order modes are more likely to occur in the horizontal transverse mode as the operating current increases. This may result in a kink phenomenon in the characteristics of optical output versus operating current. This phenomenon is undesirable because it restricts the available range of optical output of the semiconductor laser device.

A previously disclosed technology (U.S. Pat. No. 6,775, 311) involves stabilization of the horizontal transverse mode in an attempt to remedy the above problems. In this disclosed technology, a hollow portion is provided approximately parallel to the ridge waveguide in the current blocking layer.

SUMMARY OF THE INVENTION

According to an aspect of the invention, there is provided a semiconductor laser device comprising: an active layer; a cladding layer of a first conductivity type provided above the active layer, the cladding layer having a ridge portion constituting a striped waveguide and non-ridge portions adjacent to both sides of the ridge portion; an insulating film covering side faces of the ridge portion and an upper face of the non-ridge portions; a first electrode having a gap portion provided above the non-ridge portions; and a pad electrode provided on the first electrode.

According to other aspect of the invention, there is provided a semiconductor laser device comprising: a semiconductor layer having a ridge portion constituting a striped waveguide and non-ridge portions adjacent to both sides of the ridge portion; an insulating film covering side faces of the ridge portion and an upper face of the non-ridge portions; a first electrode having a gap portion provided between the first electrode provided on the ridge portion and the first electrode provided on the insulating film covering the upper face of the non-ridge portions; and a pad electrode provided on the first electrode.

DETAILED DESCRIPTION OF THE INVENTION

Embodiments of the invention will now be described with reference to the drawings.

Figure 1:
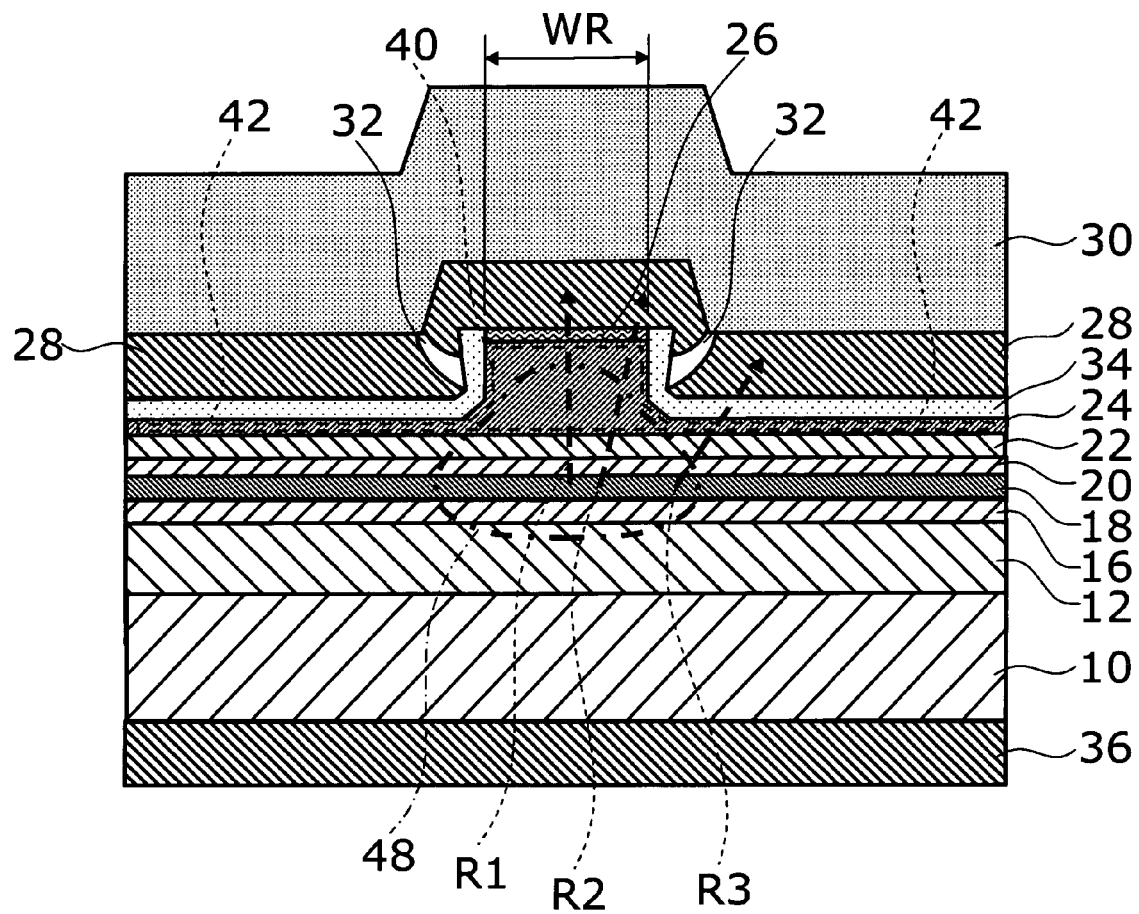
FIG. 1 is a schematic cross section of a gallium nitride based semiconductor laser device according to a first example of the invention.

FIG. 1 is a schematic cross section of a gallium nitride based semiconductor laser device according to a first example of the invention. More specifically, this figure shows the schematic structure in a cross section perpendicular to the lasing direction.

On an n-type GaN substrate 10, an n-type $Al_{0.04}Ga_{0.96}N$ cladding layer 12 (with a thickness of 2.0 μm), a GaN optical guide layer 16 (with a thickness of 0.07 μm), and an active layer 18 are laminated.

On the active layer 18, a $p^+$-type $Al_{0.20}Ga_{0.80}N$ overflow blocking layer 20 (with a thickness of 10 nm), a GaN optical guide layer 22 (with a thickness of 0.03 μm), a p-type $Al_{0.04}Ga_{0.96}N$ cladding layer 24, and a $p^+$-type GaN contact layer 26 (with a thickness of 0.1 μm) are laminated. These semiconductor multilayer films can be sequentially grown on the n-type GaN substrate 10 by, for example, MOCVD (Metal Organic Chemical Vapor Deposition) method. Note that typically, Si is used as n-type impurities and Mg is used as p-type impurities.

Note that the "gallium nitride based semiconductor" used herein includes semiconductors having any composition represented by the chemical formula $B_xIn_yAl_zGa_{1-x-y-z}N$ ($0 \leq x \leq 1$, $0 \leq y \leq 1$, $0 \leq z \leq 1$, $x+y+1 \leq 1$) where the composition ratios x, y and z are varied in the respective ranges. Furthermore, the "gallium nitride based semiconductor" also includes those further containing any of various impurities added for controlling conductivity types.

The structure illustrated in FIG. 1 belongs to a refractive index waveguide structure also referred to as the "ridge waveguide type" structure. More specifically, the p-type cladding layer 24 has a ridge portion 40 represented by dashed line and non-ridge portions 42 also represented by dashed line. Note that in the first example, the ridge portion 40 has a height of 0.45 μm, and the non-ridge portions 42 have a height of 0.01 μm.

The $p^+$-type GaN contact layer 26 above the ridge portion 40 is provided selectively. The patterned side faces of the $p^+$-type GaN contact layer 26 and of the ridge portion 40 are coated with an insulating film 34, and a protrusion is formed. The insulating film 34 can be made of material such as silicon dioxide ($SiO_2$), silicon nitride film ($Si_3N_4$), aluminum nitride (AlN), or zirconium dioxide ($ZrO_2$). Note that $SiO_2$ has a refractive index of about 1.5, and $Si_3N_4$ has a refractive index of 1.9 to 2.1.

The $p^+$-type GaN contact layer 26 is connected to a p-side electrode 28 made of Pt/Ni/Au, for example. The n-type GaN substrate 10 is connected to an n-side electrode 36 made of monolayer, lamination, or alloy of Ti, Pt, Au, or Al. The $p^+$-type GaN contact layer 26 serves to decrease a contact resistance between the p-type AlGaN cladding layer 24 and the p-side electrode 28, thereby the operating voltage is decreased.

Since the insulating film 34 is provided on the side faces of the ridge portion 40, a refractive index difference occurs between the p-type AlGaN cladding layer 24 constituting the ridge portion 40, and the insulating film 34. The p-type AlGaN cladding layer 24 has a refractive index of about 2.523 for the composition of $Al_{0.04}Ga_{0.96}N$.

Since the refractive index of the ridge portion 40 is thus higher than that of the insulating film 34, the horizontal transverse mode is confined in the horizontal transverse direction relative to the active layer 18 in the cross section orthogonal to the optical axis. However, if a width WR of the ridge portion 40 is too large relative to the wavelength, higher order modes may occur in the horizontal transverse mode. Preferably, the width WR of the ridge portion 40 is 1.5 to 3 μm. In this example, it is set to 2.0 μm. As a result, higher order modes are suppressed.

In the first example, the p-side electrode 28 has a gap portion 32 above the non-ridge portion 42. Thus, the p-side electrode 28 is divided by a gap portion 32 into a region above the ridge portion 40 and a region above the non-ridge portions 42. In this case, as illustrated in FIG. 1, the operating voltage can be reduced by the $p^+$-type GaN contact layer 26 provided between the p-side electrode 28 and the ridge portion 40 made of p-type AlGaN.

For this purpose, as will be explained later, it is preferable to form the gap region 32 to separate the ridge region 40 and the non-ridge region 42. More specifically, it is more preferable to form the gap region 32 to extend upward from the side face of the ridge portion 40. Moreover, the effect of dividing the heat dissipation path is enhanced when the gap portion 32 extends more upward than the uppermost surface of the ridge portion 40.

Because a pad electrode 30 (with a thickness of 1 to 3 μm) of Ti/Pt/Au, for example, is provided on the p-side electrode 28, the electrical connection becomes possible regardless of the gap portion 32 of the p-side electrode 28.

The gap portion 32 divides the heat dissipation path extending from the vicinity of the light emission point in the active layer 18. This chip is mounted at its pad electrode 30 side on a heat sink (not shown). Here, heat dissipation paths directed upward in the ridge portion 40 are represented by R1 and R2, for example. On the other hand, the heat dissipation path R3 divided by the gap portion 32 travels from the outside region of the light emission point through the non-ridge portion 42 near the gap portion 32 and the insulating film 34 to the p-side electrode 28.

The heat dissipation paths represented by R1 and R2 are longer because they pass through the ridge portion 40, and thus the thermal resistance is also increased. However, the presence of the gap portion 32 allows for a more uniform condition of heat dissipation in the ridge portion 40. Furthermore, the lower the thermal conductivity of the insulating film 34, the more vertically converged the heat dissipation path in the ridge portion 40, which further reduces the temperature difference in and below the ridge portion 40. For this reason, $SiO_2$ is more preferable than $Si_3N_4$, AlN, and $ZrO_2$. For example, the thermal conductivity is 1.0 W/mK for $SiO_2$, but as high as 17 W/mK for $Si_3N_4$. On the other hand, the non-ridge portions 42 adjacent to the gap portion 32 have a small heat generation and a short length of heat dissipation path to the p-side electrode 28, and therefore the temperature increase can be reduced.

Next, simulation results are used to describe the function of the first example.

Since the gap portion 32 in the first example consists of air, a simulation is performed by using a simplified model in which the p-side electrode 28 is not present on the insulating film 34 above the non-ridge portions 42.

Figure 2:
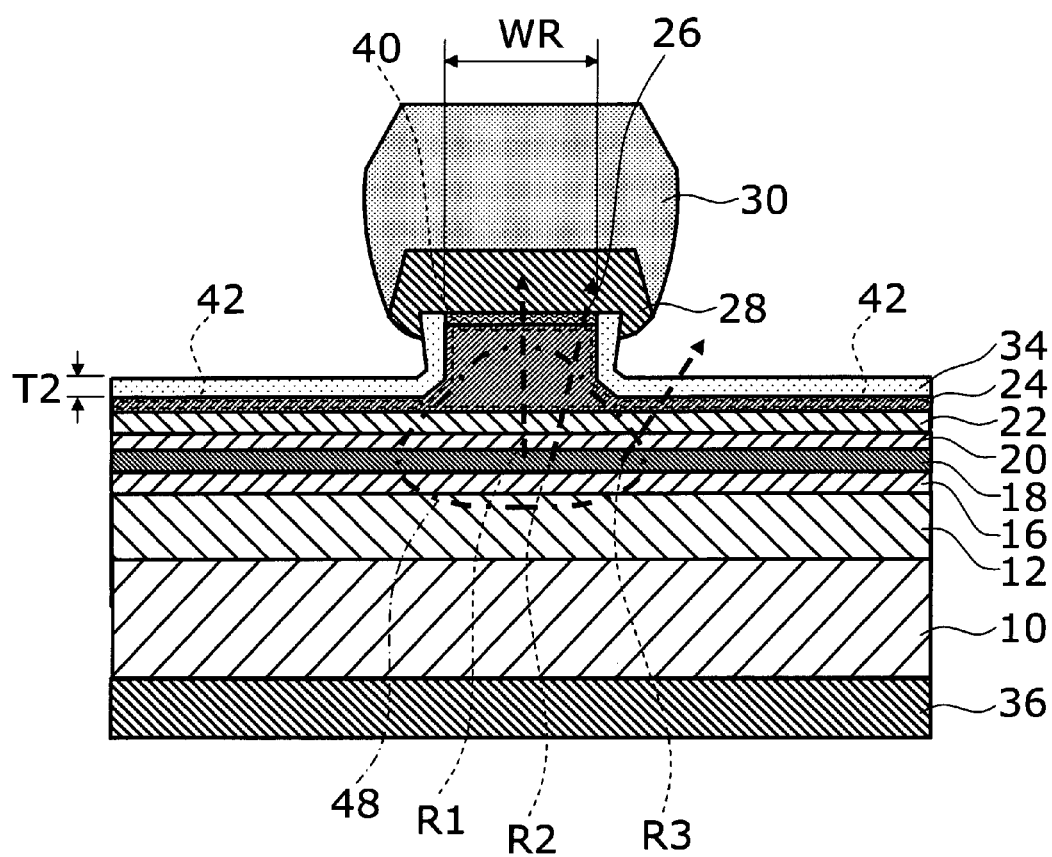
FIG. 2 is a simplified model for simulation of the first example.

FIG. 2 is a schematic cross section showing this simplified model.

Since the amount of heat dissipated through the non-ridge portions 42 is small, it is contemplated that the operation is not significantly different if such a simplified model is used. It is assumed that the insulating film 34 has a thickness T2 of 0.1 micrometer and that the ridge portion 40 has a width WR of 2.0 micrometers.

Figure 3:
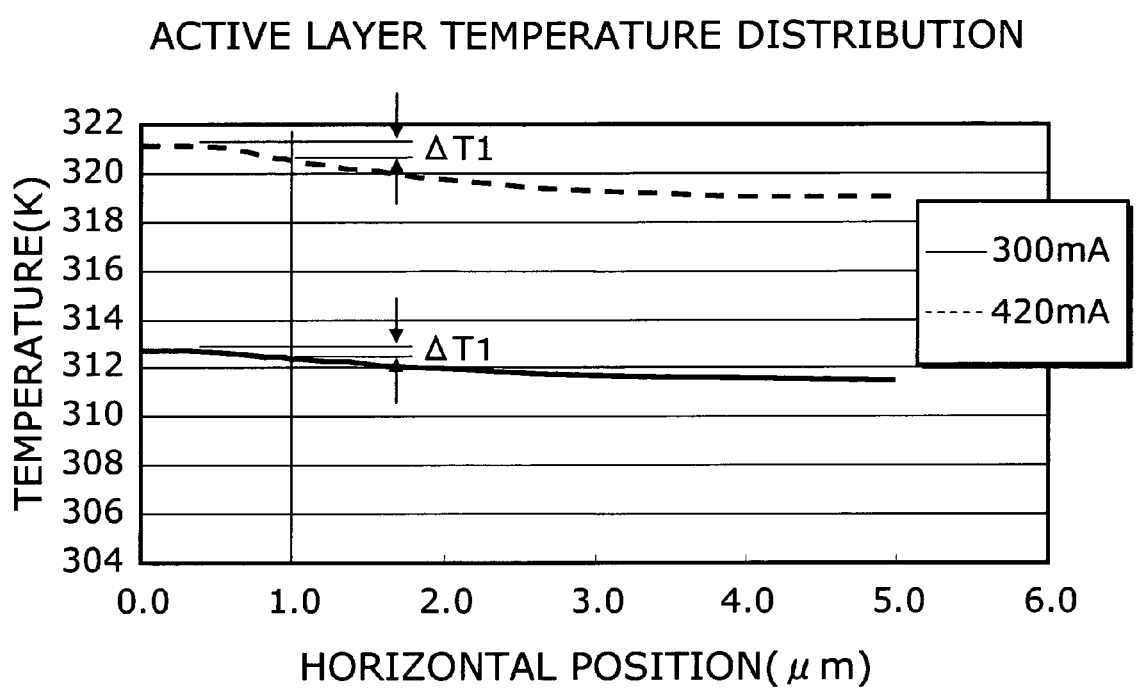
FIG. 3 is a graphical diagram showing a simulation result for the active layer temperature distribution for the first example.

FIG. 3 is a graphical diagram showing a simulation result for the temperature distribution in the active layer 18 for the simplified model of the first example. The vertical axis represents the temperature (K), and the horizontal axis represents the horizontal position from the center of the active layer 18.

In this example, since the width WR of the ridge portion 40 is 2.0 micrometers, the horizontal position of 1.0 micrometer corresponds to the position directly below the boundary between the ridge portion 40 and the non-ridge portion 42.

Referring to FIG. 3, at a high injection of 420 mA, for example, the center temperature of the active layer 18 is about 321K, and the temperature at a horizontal position of 1.0 μm is 320.5K. The temperature difference ΔT1 between these two points is 0.5K. At 300 mA, the center temperature of the active layer is 312.7K, and the temperature at a horizontal position of 1.0 μm is 312.2K. The temperature difference ΔT1 between these two points is 0.5K.

Figure 4:
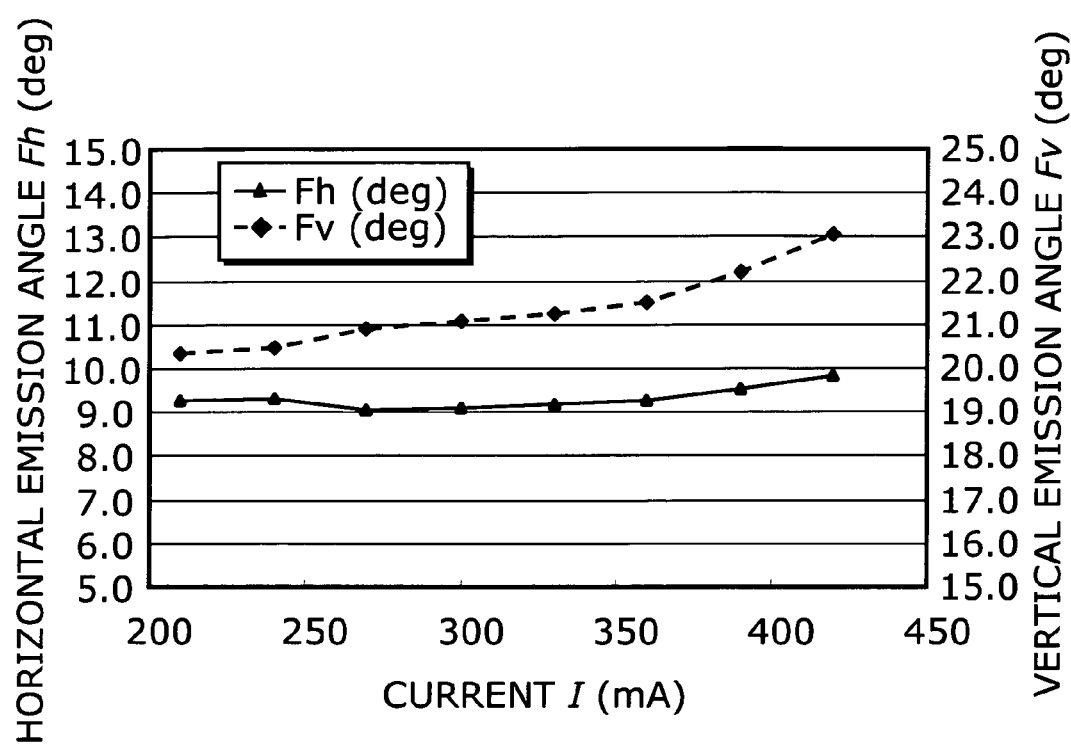
FIG. 4 is a graphical diagram showing a simulation result for the FFP of the first example.

FIG. 4 is a graphical diagram showing the FFP (Far Field Pattern), that is, the horizontal emission angle $F_h$ (deg) and vertical emission angle $F_v$ (deg), for the simplified model. The vertical axes represent $F_h$ and $F_v$, respectively, and the horizontal axis represents current (mA). $F_h$ is kept at 9.1 to 9.9 degrees in the operating range of 210 to 420 mA. $F_v$ ranges from 20.3 to 23.0 degrees in the same current range.

Next, a comparative example will be described.

Figure 5:
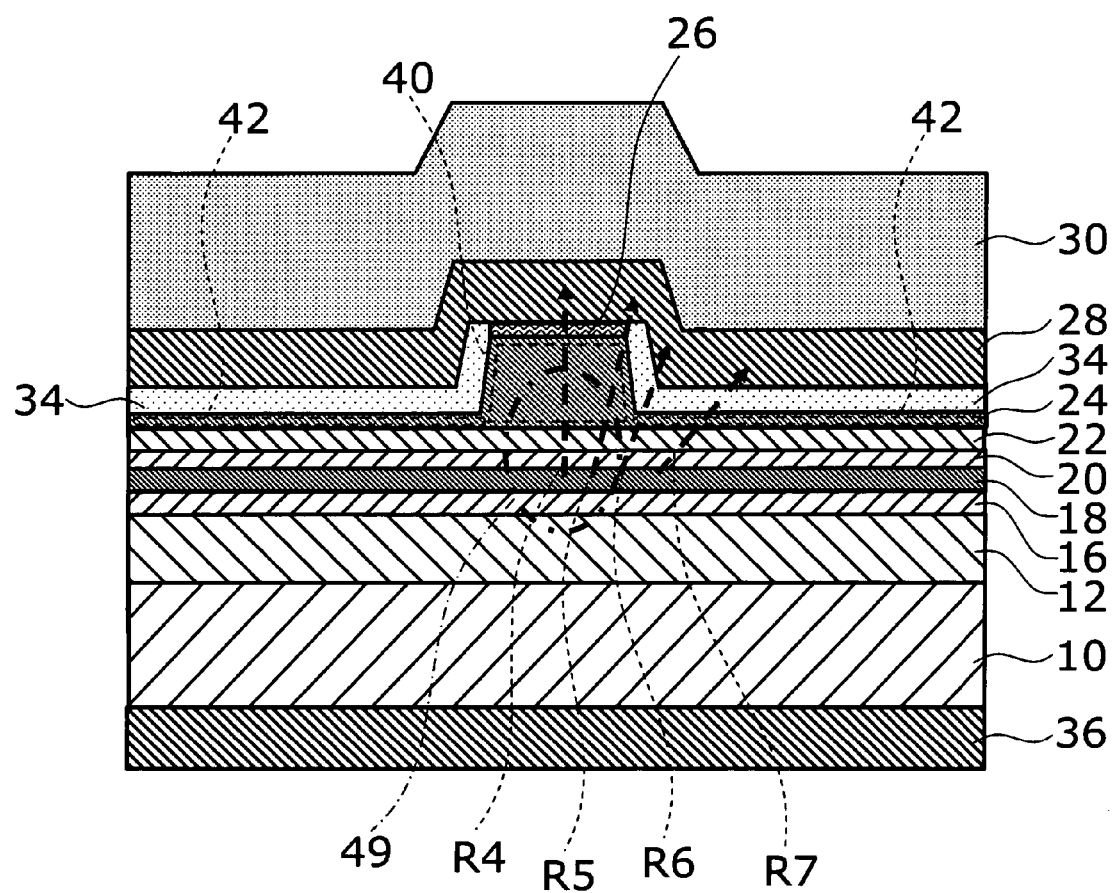
FIG. 5 is a schematic cross section showing a gallium nitride based semiconductor laser device according to a comparative example.

FIG. 5 is a schematic cross section of a gallium nitride based semiconductor laser device according to the comparative example. Components similar to those in FIG. 1 are marked with the same reference numerals and not described in detail. In the comparative example, the p-side electrode 28 is placed continuously on the ridge portion 40 and the non-ridge portions 42, and no gap portion is present.

Figure 6:
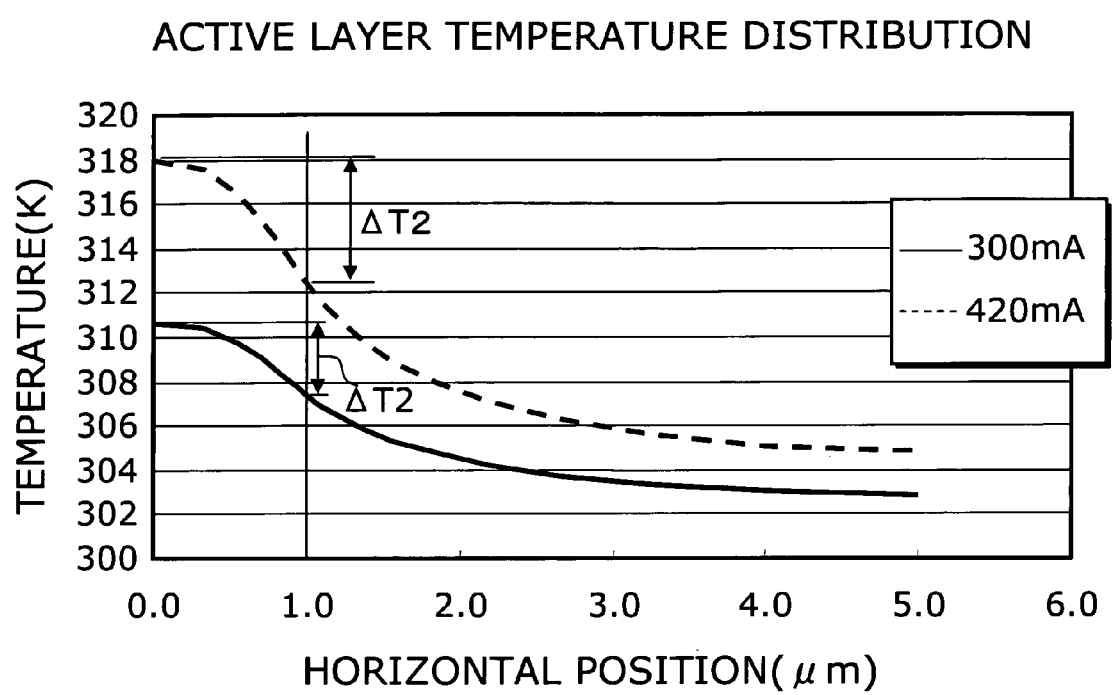
FIG. 6 is a graphical diagram showing a simulation result for the active layer temperature distribution for the comparative example.

FIG. 6 is a graphical diagram showing a simulation result for the temperature distribution in the active layer 18 for the comparative example.

Figure 7:
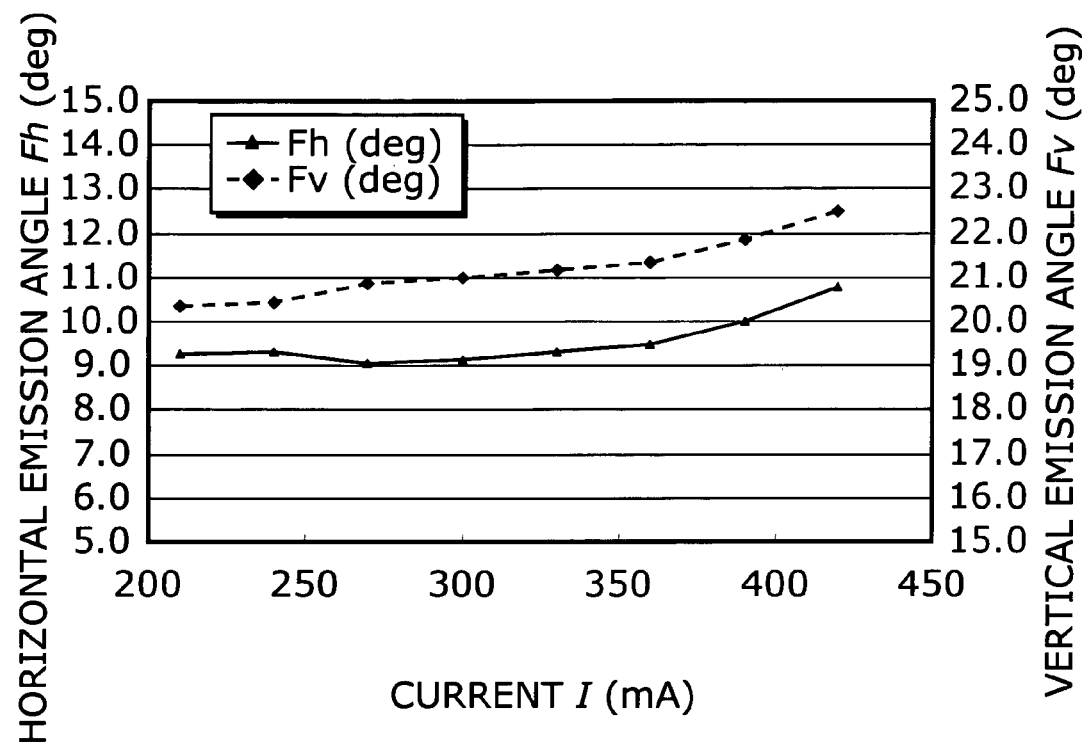
FIG. 7 is a graphical diagram showing a simulation result for the FFP of the comparative example.

At an operating current of 420 mA, for example, the center temperature of the active layer 18 is about 318K, and the temperature at a horizontal position of 1.0 μm is 312K. Therefore the temperature difference ΔT2 is 6K, which is larger than that for the first example. Likewise, at an operating current of 300 mA, the center temperature of the active layer 18 is 310.5K, and the temperature at a horizontal position of 1.0 micrometer is 307.6K. Therefore the temperature difference ΔT2 is 2.9K. The temperature difference ΔT2 for the comparative example is larger than the temperature difference ΔT1 for the first example FIG. 7 is a graphical diagram showing the FFP, that is, $F_h$ and $F_v$, for the comparative example. $F_h$ varies from 9.2 to 10.8 degrees in the current range of 210 to 420 mA. The variation is larger than in the first example. $F_v$ ranges from 20.3 to 22.7 degrees.

As can be seen from the simulation results described above, at 420 mA, for instance, the center temperature of the active layer 18 is about 3K higher in the first example than in the comparative example. However, the temperature difference between the temperatures at the active layer center and at the 1.0 μm position is 0.5K, which is significantly reduced from 6K of the comparative example. In this way, as illustrated in FIG. 1, the high-temperature region 48 represented by dot-dashed line in the first example is larger than the high-temperature region 49 in the comparative example.

In general, the refractive index of a semiconductor layer decreases as the injected carrier density increases, and increases as the temperature increases. A semiconductor laser device of the refractive index waveguide type is designed so that the refractive index is higher in the active layer 18 and the ridge portion 40 than in the outside of the ridge portion 40, even when the refractive index decreases due to carrier injection. On the other hand, a large temperature difference in the high-temperature region 49 of the active layer 18 and the ridge portion 40 increases the refractive index difference in that high-temperature region 49. This decreases the width of the ridge portion in which higher order horizontal transverse modes are cut off, and therefore higher order horizontal transverse modes are more likely to occur.

However, as illustrated in FIG. 3, in the first example, which can reduce the temperature difference ΔT1 between the temperatures at the center of the active layer 18 and below the ridge side face, the variation of the refractive index difference can be reduced, and therefore the change of optical confinement is suppressed. For example, in the current range of 210 to 420 mA, the variation of $F_h$ is 0.8 degrees in the first example and increases to 1.6 degrees in the comparative example. Therefore the first example can suppress the disturbance of FFP and the occurrence of higher order modes. This results in suppression of kink in the characteristics of optical output versus operating current, thereby achieving noise reduction and higher optical output in intensity modulation. While the temperature distribution for horizontal positions of the active layer 18 is illustrated in FIG. 3, the ridge portion 40 and the GaN optical guide layer 22 also have an equivalent horizontal temperature distribution.

Next, a process of providing the gap portion 32 in the p-side electrode 28 is described.

Figure 8:
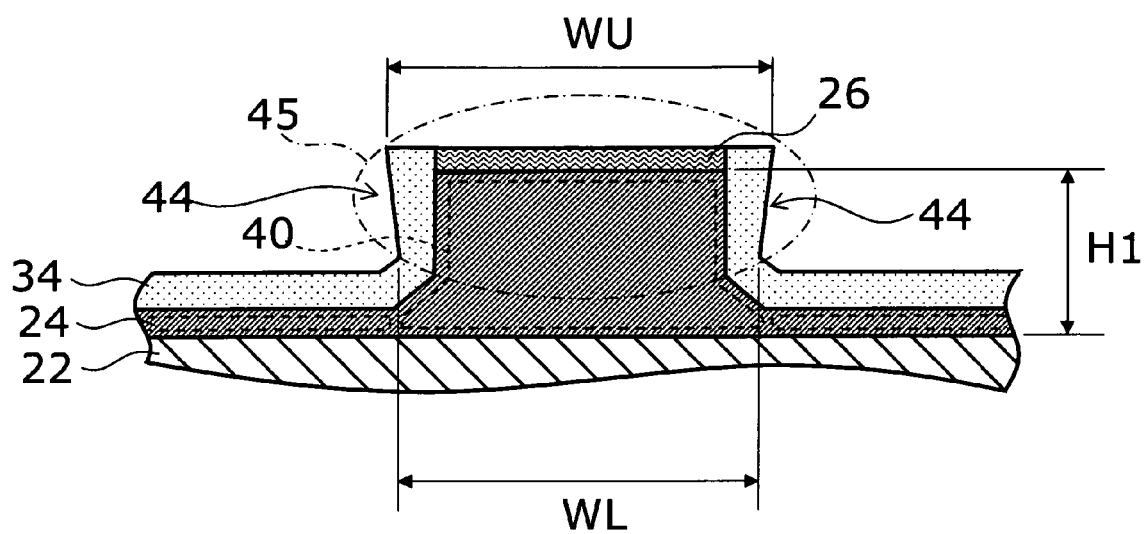
FIG. 8 is a schematic cross section showing the protrusion in the first example.

FIG. 8 is a schematic cross section showing the vicinity of the protrusion 45 on which the metal thin film of the p-side electrode 28 has yet to be deposited.

For gallium nitride based materials, it is more preferable to use primarily a dry etching process such as RIE (Reactive Ion Etching) than to use wet etching for patterning a striped ridge portion 40.

Preferably, the protrusion 45, which is the ridge portion 40 coated with the insulating film 34, has its both side faces formed to be substantially perpendicular to the major surface of the underlying layer (for example, the guide layer 22, or the active layer thereunder), or to broaden toward the upper end. More specifically, in FIG. 8, the side face of the protrusion 45, which is the ridge portion 40 coated with the insulating film 34, is made substantially perpendicular, or an upper width WU of the protrusion 45 is made larger than its lower width WL. It is then easy to form a region without electrode film at least in part on a protrusion side face 44 in the subsequent process of depositing an electrode film. The height H1 of the ridge portion 40 can be 0.45 μm, for example.

While FIG. 8 illustrates substantially perpendicular side faces of the ridge portion 40, the thickness of the insulating film may be made generally constant if the side faces of the ridge portion 40 are formed to broaden toward the upper end. Such a cross-sectional configuration of the ridge portion 40 can be achieved through the selection of crystal orientation and etching condition. By this cross-sectional configuration of the ridge portion 40, the upper width of the ridge portion 40 can be made larger relative to the forward mesa structure (in which the ridge width is narrowed toward the upper end). This results in reduction of contact resistance, thereby reducing the amount of heat generation. Furthermore, heat dissipation from the vicinity of the active layer center below the ridge portion 40 is improved. Therefore, in synergy with the increased active layer temperature in the region below the interface between the ridge portion 40 and the non-ridge portion 42, the temperature can be made more uniform in the active layer.

Figure 9:
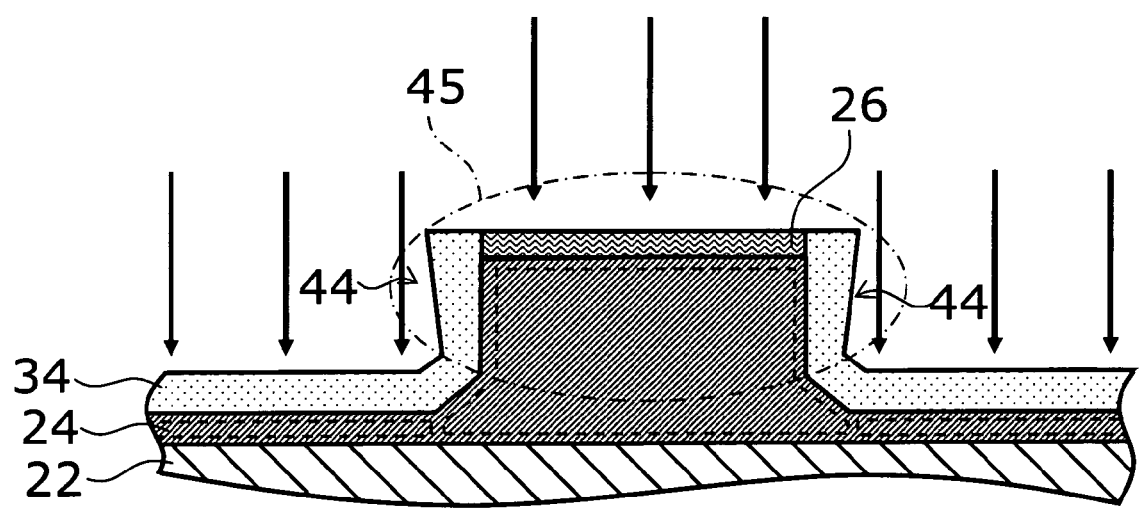
FIG. 9 shows a process of forming an electrode film in the first example.

FIG. 9 is a cross section showing an example of the process of depositing an electrode film.

Since the protrusion side face 44 is substantially perpendicular or broadens toward the upper end, a process of depositing metal from directly above by a method such as electron beam deposition, for example, can be used to prevent metal deposition from reaching the portion of the protrusion side face 44 having a narrow width. As a result, at least a portion of the protrusion side face 44 can be left without deposition of electrode film, and eventually the structure illustrated in FIG. 1 is achieved.

Figure 10:
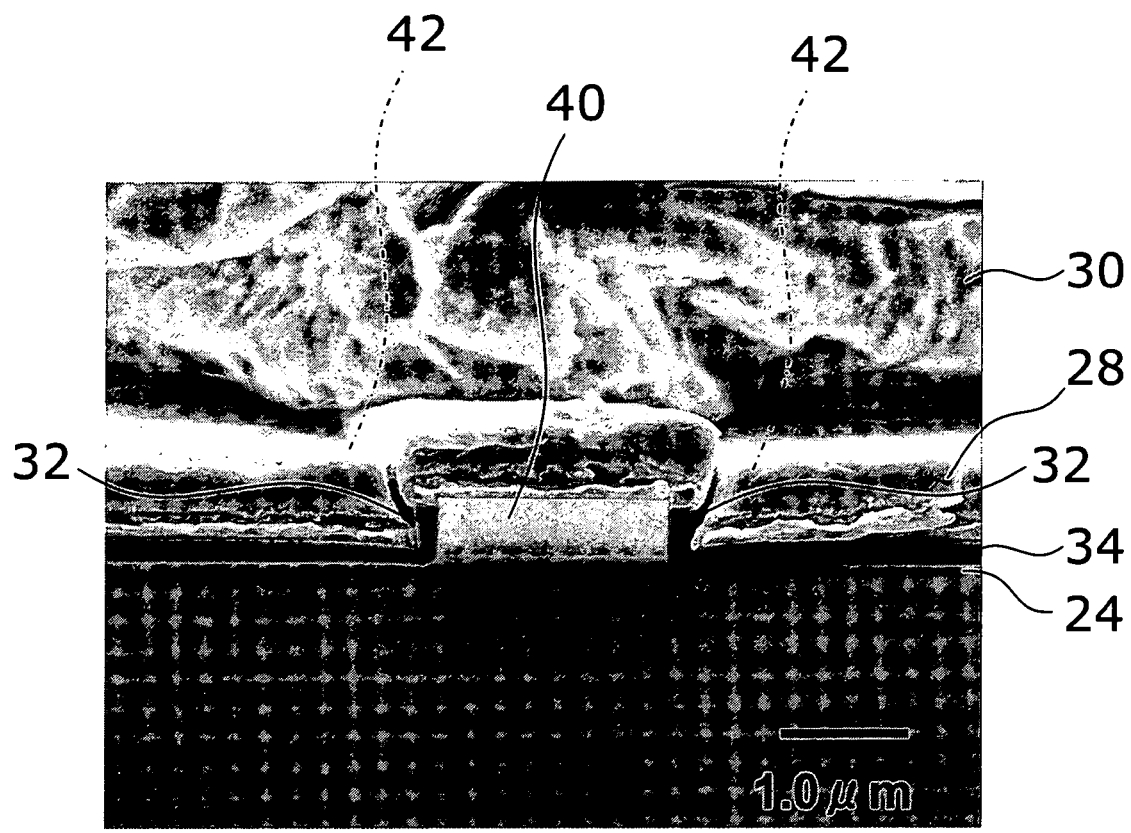
FIG. 10 is a photograph showing the structure of a gallium nitride based semiconductor laser according to the first example.
Figure 11:
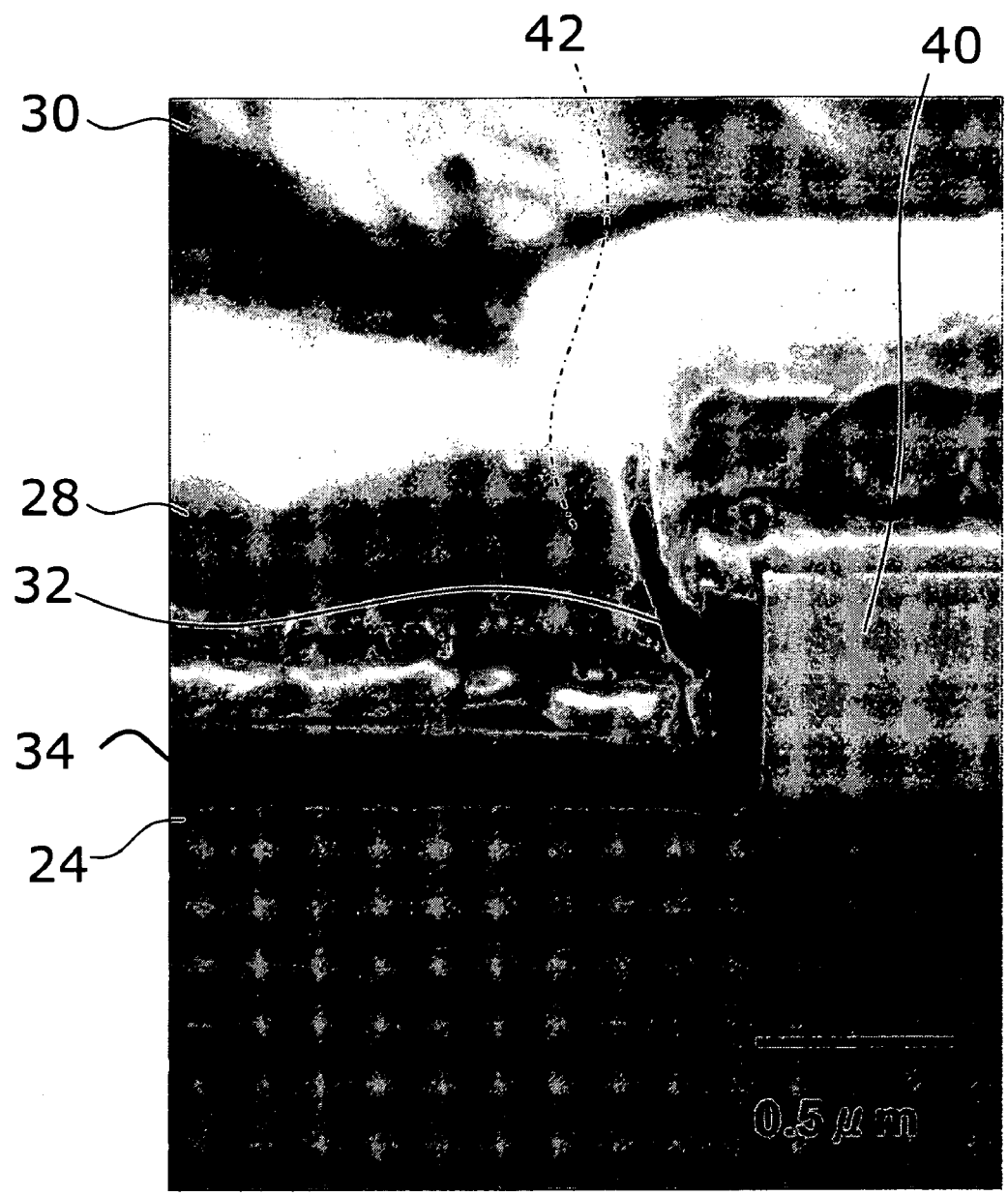
FIG. 11 is a partial enlarged photograph of the gallium nitride based semiconductor laser device according to the first example.

Next, the configuration of the gap portion 32 is described with reference to SEM (Scanning Electron Microscope) photographs. FIG. 10 is a photograph showing the vicinity of the protrusion. FIG. 11 is a partial enlarged photograph of the gap portion 32.

As can be seen from both the photographs, the p-side electrode 28 has a gap region 32 above the non-ridge region 42. That is, the protrusion side face 44 of the insulating film 34 has a region without deposition of the p-side electrode 28, which realizes a gap portion 32 as described above with reference to FIG. 1. While the gap portion 32 extends more upward than the uppermost surface of the ridge portion 40 in FIGS. 10 and 11, the invention is not limited to this configuration. More specifically, it is sufficient to provide a gap portion that divides the heat dissipation path in the vicinity of the protrusion side face. Furthermore, the uppermost portion of the insulating film 34 is located at a position slightly lower than the uppermost surface of the ridge portion 40. This configuration can also result in a similar heat dissipation property because a gap portion 32 is formed in the vicinity of the protrusion side face. Thus, it is preferable to form the gap region 32 to separate the ridge region 40 and the non-ridge region 42. More specifically, it is more preferable to form the gap region 32 to extend upward from the side face of the ridge portion 40. Moreover, it is contemplated that the effect of dividing the heat dissipation path is enhanced when the gap portion 32 extends more upward than the uppermost surface of the ridge portion 40 as illustrated in FIGS. 10 and 11.

As described above, in the first example, a gap portion 32 is provided in the p-side electrode 28 in the vicinity of the protrusion 45 to reduce the temperature difference in the active layer 18 and in the ridge portion 40. This can suppress the increase of the refractive index difference, thereby appropriately maintaining optical confinement. This results in suppression of FFP disturbance and higher order modes, which can reduce kink in the characteristics of optical output versus operating current. Therefore high output is stably obtained.

Figure 12:
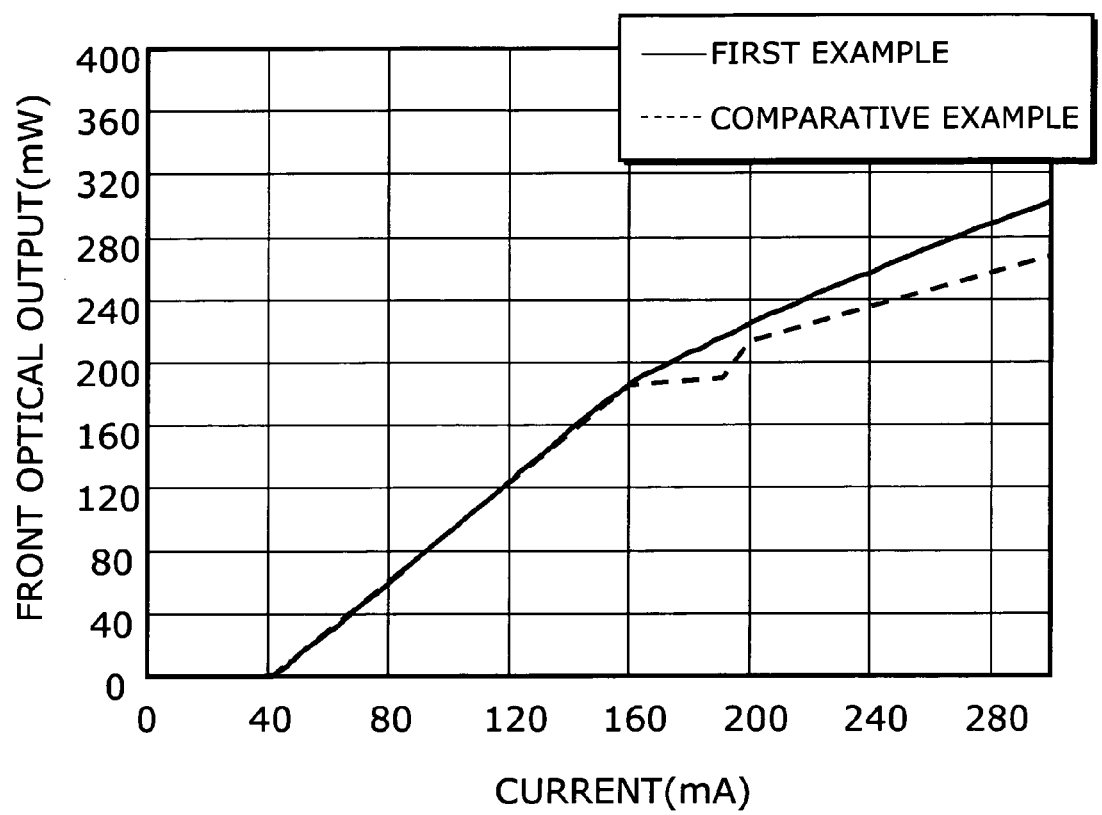
FIG. 12 is a graphical diagram showing the characteristics of optical output versus current of a gallium nitride based semiconductor device according to the first example.

FIG. 12 is a graphical diagram showing measurements of the characteristics of optical output versus current of a blue-violet semiconductor laser device in the 400-nanometer wavelength band according to the first example and the comparative example. The device is subjected to pulsed operation at a duty ratio of 50% and at an ambient temperature Ta=80° C.

The gallium nitride based semiconductor laser device according to the first example, which produces a kink-free optical output exceeding 200 mW, can satisfy the specification for the next generation DVD application. On the contrary, in the comparative example, a kink occurs at a point exceeding an output of 170 mW in the characteristics of optical output versus current. Operation at an optical output above this point is not desirable.

Embodiments of the invention have been described with reference to the drawings. However, the invention is not limited to these examples.

Any size, material, and arrangement of various elements including the ridge portion, non-ridge portions, electrode, gap portion, and semiconductor multilayer film constituting the semiconductor laser device that are variously adapted by those skilled in the art are also encompassed within the scope of the invention.

The invention claimed is:

1. A semiconductor laser device comprising:
an active layer;
a cladding layer of a first conductivity type provided above the active layer, the cladding layer having a ridge portion constituting a striped waveguide and non-ridge portions adjacent to both sides of the ridge portion;
an insulating film covering side faces of the ridge portion and an upper face of the non-ridge portions;
a first electrode having a gap portion provided above the non-ridge portions; and
a pad electrode provided on the first electrodes,
the pad electrode covering the gap portion and being in contact with the first electrode on the non-ridge portions and on the ridge portion.

2. A semiconductor laser device according to claim 1, wherein the gap portion is provided adjacent to the insulating film covering the side faces of the ridge portion.

3. A semiconductor laser device according to claim 2, wherein the gap portion extends upward from the insulating film covering the side faces of the ridge portion.

4. A semiconductor laser device according to claim 3, wherein an uppermost portion of the gap is located at a a position higher than an uppermost surface of the ridge portion.

5. A semiconductor laser device according to claim 3, wherein the gap portion contacts with the pad electrode.

6. A semiconductor laser device according to claim 3, wherein an uppermost portion of the insulating film is located at a position lower than an uppermost surface of the ridge portion.

7. A semiconductor laser device according to claim 1, wherein a protrusion composed of the ridge portion and the insulating film provided on the side faces of the ridge portion has side faces substantially perpendicular to a major surface of the active layer.

8. A semiconductor laser device according to claim 1, wherein a protrusion composed of the ridge portion and the insulating film provided on the side faces of the ridge portion includes a region broadening toward an upper end.

9. A semiconductor laser device according to claim 1, wherein the pad electrode extends continuously from above the ridge portion to above the non-ridge portions.

10. A semiconductor laser device according to claim 1, wherein the first electrode have gap portions provided above the non-ridge portions on both sides of the ridge portion.

11. A semiconductor laser device according to claim 1, wherein the first electrode is provided adjacent to the insulating film covering the side surfaces of the ridge portion and the gap portion provided within the first electrode is located near the side faces of the ridge portion.

12. A semiconductor laser device comprising:
a semiconductor layer having a ridge portion constituting a striped waveguide and non-ridge portions adjacent to both sides of the ridge portion;
an insulating film covering side faces of the ridge portion and an upper face of the non-ridge portions;
a first electrode having a gap portion provided between the first electrode provided on the ridge portion and the first electrode provided on the insulating film covering the upper face of the non-ridge portions; and
a pad electrode provided on the first electrodes,
the pad electrode covering the gap portion and being in contact with the first electrode on the non-ridge portions and on the ridge portion.

13. A semiconductor laser device according to claim 12, wherein the gap portion is provided adjacent to the insulating film covering the side faces of the ridge portion.

14. A semiconductor laser device according to claim 13, wherein the gap portion extends upward from the insulating film covering the side faces of the ridge portion.

15. A semiconductor laser device according to claim 14, wherein an uppermost portion of gap portion is located at a position higher than an uppermost surface of the ridge portion.

16. A semiconductor laser device according to claim 14, wherein the gap portion contacts with the pad electrode.

17. A semiconductor laser device according to claim 14, wherein an uppermost portion of the insulating film is located at a position lower than an uppermost surface of the ridge portion.

18. A semiconductor laser device according to claim 12, wherein a protrusion composed of the ridge portion and the insulating film provided on the side faces of the ridge portion has side faces substantially perpendicular to a major surface of the non-ridge portion.

19. A semiconductor laser device according to claim 12, wherein a protrusion composed of the ridge portion and the insulating film provided on the side faces of the ridge portion includes a region broadening toward an upper end.

20. A semiconductor laser device according to claim 12, wherein the pad electrode extends continuously from above the ridge portion to above the non-ridge portions.

* * * * *